United States Patent [19]
Anderson

[11] Patent Number: 5,880,936
[45] Date of Patent: Mar. 9, 1999

[54] PC CARD TEST AND CONFIGURATION CONNECTOR

[75] Inventor: Daniel Joseph Anderson, Richmond, Va.

[73] Assignee: Barber Colman, Loves Park, Ill.

[21] Appl. No.: 916,909

[22] Filed: Aug. 14, 1997

[51] Int. Cl.$^6$ ................................................. H05K 7/14
[52] U.S. Cl. ..................... 361/752; 361/686; 361/737; 361/748; 439/76.1
[58] Field of Search ............................. 361/736, 737, 361/748, 749, 752, 789, 796, 686; 257/723, 724; 439/59, 76.1, 328, 329; 395/281–284; 324/754, 755, 760, 765

[56] References Cited

U.S. PATENT DOCUMENTS

| | | | |
|---|---|---|---|
| 4,145,620 | 3/1979 | Dice | 361/796 |
| 5,519,577 | 5/1996 | Dudas et al. | 361/737 |
| 5,615,344 | 3/1997 | Corder | 395/309 |
| 5,719,749 | 2/1998 | Stopperan | 361/749 |
| 5,748,912 | 5/1998 | Lee | 395/282 |

OTHER PUBLICATIONS

Demand Increases for PC Card Connectors, Maker Responds with Diverse Variety/By Yasumase Hayashida/ JEE Nov. 1994/pp. 35–36, 49.

Selecting PC Card Connectors/By Joel Urban/ Interconnection Technology Apr. 1994/pp. 16–19.
PCMCIA Design Techniques, Part II/by Dan Baumgartner/ Printed Circuit Design September 1995/pp. 32–33.
PCMCIA Design Techniques, Part I/by Dan Baumgartner/ Printed Circuit Design Aug. 1995/pp. 17–21.
PCMCIA Process Selection/by Steve Malfitano and Dale Benson/Circuits Assemble Jul. 1994/pp. 30–31, 33.
PCMCIA Testing and Final Assembly/by Rich Freiberger/ Circuits Assembly Mar. 1995/pp. 42, 44–45.
PCMCIA Process Development/by George Zbranek, Jr./ Circuit Assembly Mar. 1995/pp. 46–50.
Test Fixture Solutions for PC Cards/by Jim O'Leary/pp. 921–924.
Molex/Embossed Tape Packaging of SMT Connectors/Catalog #950/pp. F–3, F21.

*Primary Examiner*—Leo P. Picard
*Assistant Examiner*—John B. Vigushin
*Attorney, Agent, or Firm*—Jules Jay Morris; David Barron; Terrence Martin

[57] ABSTRACT

A PC Card includes a printed wiring board with an edge-card connector formed integral therewith. Wiring of the printed wiring board connects the edge-card connector to components on the printed wiring board. Connection is established to the printed wiring board via the edge-card connection for testing and programming of components on the PC Card.

16 Claims, 2 Drawing Sheets

PC CARD TEST AND CONFIGURATION CONNECTOR

TECHNICAL FIELD

The present invention relates, in general, to PC Card technology. More specifically, the present invention relates to a test and configuration connector for a PC Card.

BACKGROUND OF THE INVENTION

PC Cards, also known as PCMCIA cards, are designed according to a well-defined industry standard. This standard governs many aspects of PC Cards including relevant mechanical standards which include the requirements of the card's 68-pin host connector, overall dimensions and operating environment.

Assembly and testing of PC Cards can be problematic due to the defining standard. For example, as PC Cards are quite small, the allocation of test points on the card is severely restricted. Thus, it is difficult to make many electrical connections to PC Cards for the purposes of testing and initial configuration (for example, programming memories and programmable logic). Furthermore, the thinness of the PC Cards severely restricts the use of many conventional connectors due to mechanical constraints. Thus, establishing electrical connection to a PC Card during assembly and testing is problematic.

One type of connector previously used in non-PC Card applications is the card-edge connector. However, to date, the card-edge connector remains excluded from PC Card applications for several reasons. Firstly, by nature of the PC Card standard, card-edge connectors are not viable as external connectors in a packaged card as they do not provide the required shielding and electrostatic discharge protection. Secondly, PC Card printed wiring boards ("PWBs") are thin (e.g., 0.018") and not suitable for the standard edge-card connectors which require a PWB thickness of, e.g., 0.062". Also, conventional card-edge connectors require excessive contact area for use in the limited space of a PC Card. Thus, edge-card connector techniques have been heretofor excluded from PC Cards.

Other types of connectors exist, but are not conventionally used in connection with PC Card technology. For example, turning briefly to FIG. 1, prior art usage of one other type of connector 13 is shown. A conventional PWB 11 (i.e., a 'thick', non-PC Card PWB) has connector 13 connected thereto. A flat cable 15 (or flexible printed circuitry) is plugged into connector 13 thereby electrically connecting thereto.

The present invention is directed towards a card-edge connectivity solution for PC Card configuration and testing.

SUMMARY OF THE INVENTION

Briefly described, in a first aspect, the present invention includes a PC Card including a printed wiring board having at least one electronic component mechanically disposed thereon and electrically coupled thereto. The printed wiring board including a card-edge connection defined by wiring of the printed wiring board. The wiring couples electrical signals from the card-edge connection to at least the electronic component by at least one wire of the wiring of the printed wiring board.

Regarding dimensions of the PC Card, it may have a thickness of less than 0.8 mm, and more particularly, a thickness of between 0.4 and 0.8 mm. The card-edge connection may have multiple contacts, wherein the contact pitch is less than 1.27 mm and more specifically, may be between 0.8 mm and 1.27 mm.

In further regard to the PC Card, it may be unenclosed, or disposed within a case. If disposed within a case, it may be oriented such that the card-edge connection is within the case and inaccessible from outside the case.

In one embodiment, the at least one component is an electrically programmable component. Further, the wiring of the printed wiring board is adapted to route signals from the card-edge connector to the electrically programmable component to facilitate programming thereof.

In a further aspect, the present invention includes a method for production of a PC Card. The method includes providing a printed wiring board having at least one electronic component mechanically disposed thereon and electrically coupled thereto. The printed wiring board including a card-edge connection defined by wiring of the printed wiring board, wherein the wiring couples electrical signals from the card-edge connection to at least the electronic component by at least one wire of the wiring of the printed wiring board.

The method further includes mechanically and electrically attaching an electrical connector to the card-edge connection. Also, the method includes programming and/or testing the PC Card using electrical signals coupled to the PC Card through the card-edge connection.

The present invention has several advantages and features associated with it. Firstly, as the card-edge connector is integral with the PC Card PWB, there is no parts cost associated therewith. Further, the integral connector is more reliable as there is no "jack" soldered to the PWB. Secondly, a reliable, temporary or semi-permanent connection can be made to the board without a complicated, dedicated and expensive test fixture, and without manually soldering wires to points on the board. Thirdly, some of the pins that are available on the card-edge connector may not necessarily be required part of the PC card's final function thereby freeing application connector pins. Fourthly, in-circuit programmable devices may be used and do not require pre-programming before soldering. Lastly, the card-edge connector facilitates factory testing and programming of on-card devices directly, without necessitating bus-interface hardware on the board to connect these parts onto the PC card's data bus (this saves the cost, board space, and development effort that would otherwise be spent on interface hardware).

BRIEF DESCRIPTION OF THE DRAWINGS

The subject matter regarded as the present invention is particularly pointed out and distinctly claimed in the concluding portion of the specification. The invention, however, both as to organization and method of practice, together with further objects and advantages thereof, may best be understood by reference to the following detailed description taken in conjunction with the accompanying drawings in which:

DETAILED DESCRIPTION OF A PREFERRED EMBODIMENT

Figure 1:
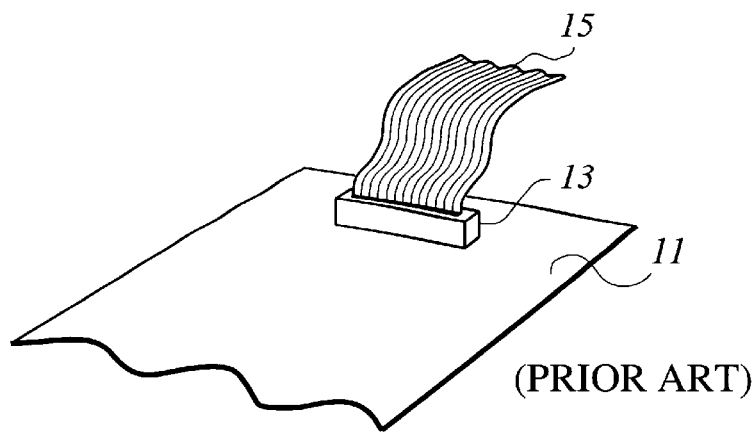
FIG. 1 is a drawing of a prior-art ribbon cable connector on a non-PC Card PWB.

According to the present invention, a card-edge connector is fabricated as part of a PC Card PWB using the wiring of the PWB. Due to the thinness of the PC Card PWB and the contact pitch required of a card-edge connector thereon, conventional card-edge connector technology is not useable. However, according to the present invention, a connector (e.g., connector 13 of FIG. 1) normally used for attaching a flat cable or flexible printed circuitry to a conventional PWB (i.e., thick; non-PC Card standard) is used to contact the card-edge connector of the PC Card PWB. In brief, the PC Card PWB plugs into the connector where the 'flat cable' normally would. Further, the connector may be, for example, mounted on a 'thick' PWB or wired-to with discrete wiring. After PC Card assembly and testing are complete, and after the PWB is encased, the card-edge connector of the PWB is no longer externally accessible.

Figure 2:
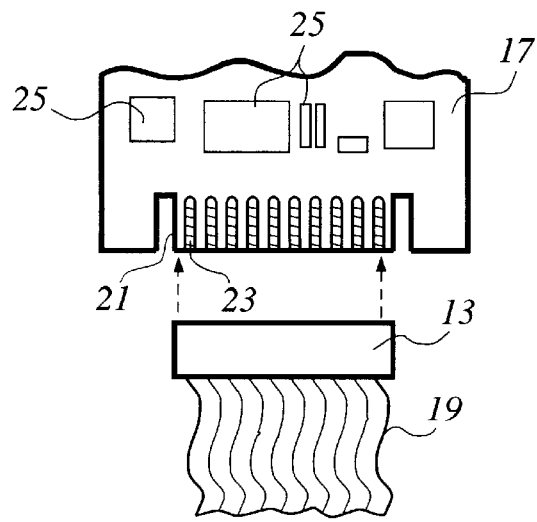
FIG. 2 is a diagram of a PC Card PWB and associated card-edge connector in accordance with an embodiment of the present invention.

Turning to FIG. 2, and according to the present invention, a PWB 17 of a PC Card is shown. PWB 17 is of conventional thickness (e.g., ranging from 0.4 mm 0.8 mm; 0.4 mm in one example embodiment) for a PC Card PWB. Disposed on PWB 17 are multiple electronic components 25 which may be selected from a variety of active and passive componentry to facilitate the desired functionality of the PC Card.

A card-edge connector 21 is formed as part of PWB 17. In particular, PWB 17 is shaped to mechanically form card-edge connector 21. Furthermore, the wiring of PWB 17 is designed to form contacts 23 of card-edge connector 21. The pitch of contacts 23 will vary in accordance with implementation requirements of the techniques disclosed herein and may range, in one embodiment, from 0.8 mm to 1.27 mm. Further, the number of contacts will vary with implementation requirements. In example embodiments, 0.8 mm pitch, 15 position; 1.27 mm pitch, 15 position; 1.27 mm pitch, 9 position; and 0.8 mm pitch, 33 position edge-card connectors 21 may be implemented.

Also shown in FIG. 2 is connector 13 which provides mechanical and electrical attachment to card-edge connector 21 of PWB 17. Connector 13 is selected to mechanically and electrically mate with card-edge connector 21 described above. Electrical attachment to the wiring side of connector 13 can be through discrete wires 19 connected thereto. Alternately, connector 13 can be mounted on a conventional (i.e., thick) printed wiring board.

The PC Card card-edge connector of the present invention has many uses including PC Card testing and programming. That is, during assembly of the PC Card, the populated PWB 17 can be attached to a test and/or programming system using connector 13. This system can exercise various functions in PWB 17. Advantageously, the need for special test jigs required to connect to test points on PWB 17 is mitigated. Moreover, the many connections provided by card-edge connector 21 facilitate granular testing.

A further use of the card-edge connector is for PC Card programming. To explain, the PC Card may contain one or more programmable electronic components including, e.g., non-volatile memories and programmable gate arrays. The card-edge connector can be electrically coupled to these components (either directly or though other components) to facilitate the programming and/or configuration thereof.

Figure 4:
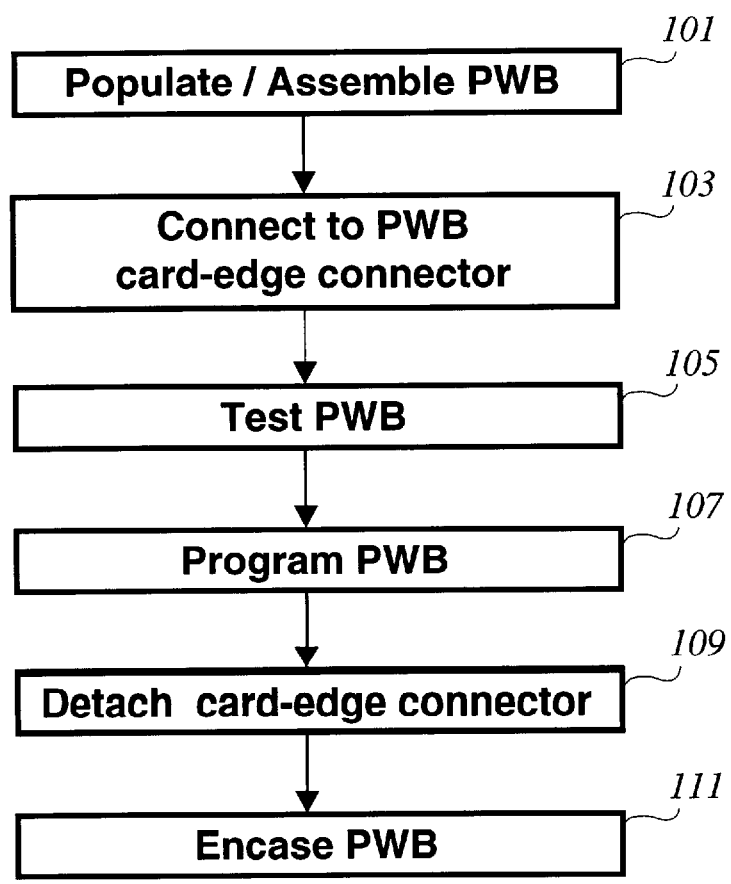
FIG. 4 is a flow-diagram of a method for PC Card assembly according to one embodiment of the present invention.

One PC Card assembly procedure in accordance with the above is depicted in FIG. 4. To begin, an assembled PWB for a PC Card is provided (STEP 101). Assembly can be performed locally or in another location. Thereafter, the card-edge connector of the PWB is plugged into a mating connector thereby facilitating electrical connection to the PWB (STEP 103).

To continue, using the established PWB electrical connection, testing of the PWB is performed (STEP 105). Testing may include repair and re-test steps if appropriate. After testing is complete, and the PWB is acceptable, programming (including configuration) of devices on the PWB may be performed (STEP 107). Programming may also and/or alternately occur before testing. After completion of the above, the card-edge connection is detached (STEP 109) and the next stages of assembly are performed. For example, in a next stage of assembly, the PWB is encased in a housing (STEP 111) making the card-edge connector inaccessible. PC Card standards are thereby upheld in the completed PC Card.

Figure 3:
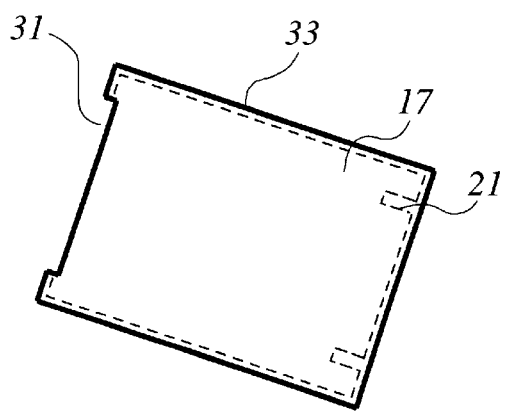
FIG. 3 is a diagram of an encased PC Card pursuant to an embodiment of the present invention.

Turning to FIG. 3, a completed PC Card in accordance with the present invention is depicted. A case 33 encloses PWB 17 which includes card-edge connector 21. A conventional 68-pin connector 31 is provided for connection of the PC Card to a host.

While the invention has been described in detail herein, in accordance with certain preferred embodiments thereof, many modifications and changes thereto may be affected by those skilled in the art. Accordingly, it is intended by the appended claims to cover all such modifications and changes as fall within the true spirit and scope of the invention.

I claim:

1. A PC Card including a printed wiring board having at least one electronic component mechanically disposed thereon and electrically coupled thereto, said printed wiring board, said wiring coupling electrical signals from said card-edge connection to at least said electronic component by at least one wire of said printed wiring board also including a host connector mechanically associated with a different edge of said printed wiring board than said card edge connection wherein said printed wiring board is disposed within a case such that said card-edge connection is within said case and inaccessible from outside said case.

2. The PC Card of claim 1, wherein a thickness of said printed wiring board is less than 0.8 mm.

3. The PC Card of claim 2, wherein said thickness of said printed wiring board is between 0.4 mm and 0.8 mm.

4. The PC Card of claim 2, wherein said card-edge connection defined by said wiring of said printed wiring board comprises a plurality of contacts, and wherein contact pitch is less than 1.27 mm.

5. The PC Card of claim 4, wherein said card-edge connection defined by said wiring of said printed wiring board comprises a plurality of contacts, and wherein said contact pitch is between 0.8 mm and 1.27 mm.

6. The PC Card of claim 1, wherein said at least one component is an electrically programmable component, and wherein said wiring of said printed wiring board is adapted to route signals from said card-edge connection to said electrically programmable component to facilitate programming of said electrically programmable component.

7. The PC Card of claim 6, wherein said routing of signals by said wiring is one of directly from said card-edge connection to said electrically programmable component, and at least partially through circuitry coupling said card-edge connection and said electrically programmable component.

8. A PC Card including a printed wiring board having at least one electronic component mechanically disposed theron and electrically coupled thereto, said printed wiring board having a thickness of less than 0.8 mm and including a card-edge connection defined by wiring of said printed wiring board, said wiring coupling said card-edge connection to at least said electonic component by at least one wire of said wiring of said printed wiring board, wherin said card-edge connection has a plurality of contacts disposed thereon a pitch of spacing between said contacts being between 0.8 mm and 1.27 mm, and wherein said PC Card includes a case within which said printed wiring board is disposed.

9. A method for production of a PC Card comprising:
   (a) providing a printed wiring board having at least one electronic component mechanically disposed thereon and electrically coupled thereto, said printed wiring board including a card-edge connection defined by wiring of said printed wiring board, said wiring coupling electrical signals from said card-edge connection to at least said electronic component by at least one wire of said wiring of said printed wiring board, and said printed wiring board also including a host connector mechanically associated with a different edge of said printed wiring board than said card-edge connection;
   (b) mechanically and electrically attaching an electrical connector to said card-edge connection;
   (c) at least one of programming and testing said PC Card using electrical signals coupled to said PC Card through said card-edge connection; and
   (d) enclosing said printed wiring board within a PC Card case such that said card-edge connection is within said case and inaccessible from outside said case.

10. The method of claim 9, further comprising disconnecting said electrical connector from said card-edge connection.

11. A PC Card including a printed wiring board having at least one electronic component mechanically disposed thereon and electrically coupled thereto, said printed wiring board including a card-edge connection defined by wiring of said printed wiring board, said wiring coupling electrical signals from said card-edge connection to at least said electronic component by at least one wire of said wiring of said printed wiring board, and wherein said printed wiring board is disposed within a case such that said card-edge connection is within said case and inaccessible from outside said case.

12. A method for production of a PC Card comprising:
   (a) providing a printed wiring board having at least one electronic component mechanically disposed thereon and electrically coupled thereto, said printed wiring board including a card-edge connection defined by wiring of said printed wiring board, said wiring coupling electrical signals from said card-edge connection to at least said electronic component by at least one wire of said wiring of said printed wiring board;
   (b) mechanically and electrically attaching an electrical connector to said card-edge connection;
   (c) at least one of programming and testing said PC Card using electrical signals coupled to said PC Card through said card-edge connection;
   (d) disconnecting said electrical connector from said card-edge connection; and
   (e) enclosing said printed wiring board within a PC Card case such that said card-edge connection is within said case and inaccessible from outside said case.

13. A PC Card including a printed wiring board having at least one electronic component mechanically disposed thereon and electrically coupled thereto, said printed wiring board including a card-edge connection defined by wiring of said printed wiring board, said wiring coupling electrical signals from said card-edge connection to at least said electronic component by at least one wire of said wiring of said printed wiring board and said printed wiring board also including a host connector mechanically associated with a different edge of said printed wiring board than said card edge connection, wherein a thickness of said printed wiring board is less than 0.8 mm.

14. The PC Card of claim 13, wherein said thickness of said printed wiring board is between 0.4 mm and 0.8 mm.

15. The PC Card of claim 13, wherein said card-edge connection defined by said wiring of said printed wiring board comprises a plurality of contacts, and wherein contact pitch is less than 1.27 mm.

16. The PC Card of claim 15, wherein said card-edge connection defined by said wiring of said printed wiring board comprises a plurality of contacts, and wherein said contact pitch is between 0.8 mm and 1.27 mm.

* * * * *